(12) United States Patent
Keinert et al.

(10) Patent No.: US 8,762,919 B2
(45) Date of Patent: Jun. 24, 2014

(54) CIRCUIT MACRO PLACEMENT USING MACRO ASPECT RATIO BASED ON PORTS

(75) Inventors: Joachim Keinert, Boeblingen (DE);
Juergen Koehl, Boeblingen (DE);
Thomas Ludwig, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 12/949,998

(22) Filed: Nov. 19, 2010

(65) Prior Publication Data
US 2011/0289468 A1    Nov. 24, 2011

(30) Foreign Application Priority Data

Dec. 9, 2009  (EP) .................................... 09178482

(51) Int. Cl.
*G06F 17/50* (2006.01)

(52) U.S. Cl.
USPC ........... 716/124; 716/118; 716/119; 716/122; 716/125

(58) Field of Classification Search
CPC .......................... G06F 17/5068; G06F 17/5072
USPC .................................. 716/104–105, 118–131
See application file for complete search history.

(56) References Cited

U.S. PATENT DOCUMENTS

| | | | | |
|---|---|---|---|---|
| 5,926,632 A * | 7/1999 | Kawaguchi | | 716/105 |
| 6,002,857 A * | 12/1999 | Ramachandran | | 716/122 |
| 6,487,706 B1 * | 11/2002 | Barkley et al. | | 716/112 |
| 6,567,967 B2 * | 5/2003 | Greidinger et al. | | 716/108 |
| 7,318,211 B2 * | 1/2008 | Cadieux | | 716/113 |
| 7,836,419 B1 * | 11/2010 | McGaughy et al. | | 716/125 |
| 7,962,877 B2 * | 6/2011 | Keinert et al. | | 716/119 |
| 2002/0087939 A1 * | 7/2002 | Greidinger et al. | | 716/2 |
| 2006/0053396 A1 * | 3/2006 | Eng | | 716/7 |
| 2010/0037198 A1 * | 2/2010 | Keinert et al. | | 716/17 |
| 2010/0325600 A1 * | 12/2010 | Wu et al. | | 716/130 |

* cited by examiner

*Primary Examiner* — Stacy Whitmore
(74) *Attorney, Agent, or Firm* — Cantor Colburn LLP; Margaret McNamara

(57) ABSTRACT

Fixed outline shaped and modifiable outline shaped random logic macros of an electronic circuit design are manipulated by modifying an outline of a modifiable outline shape macro based on criteria consisting of any one of a macro port weight value, a macro port ordering; a macro rapport constraint or a macro logic depth and placing resulting macros at locations on an integrated circuit (chip).

18 Claims, 21 Drawing Sheets

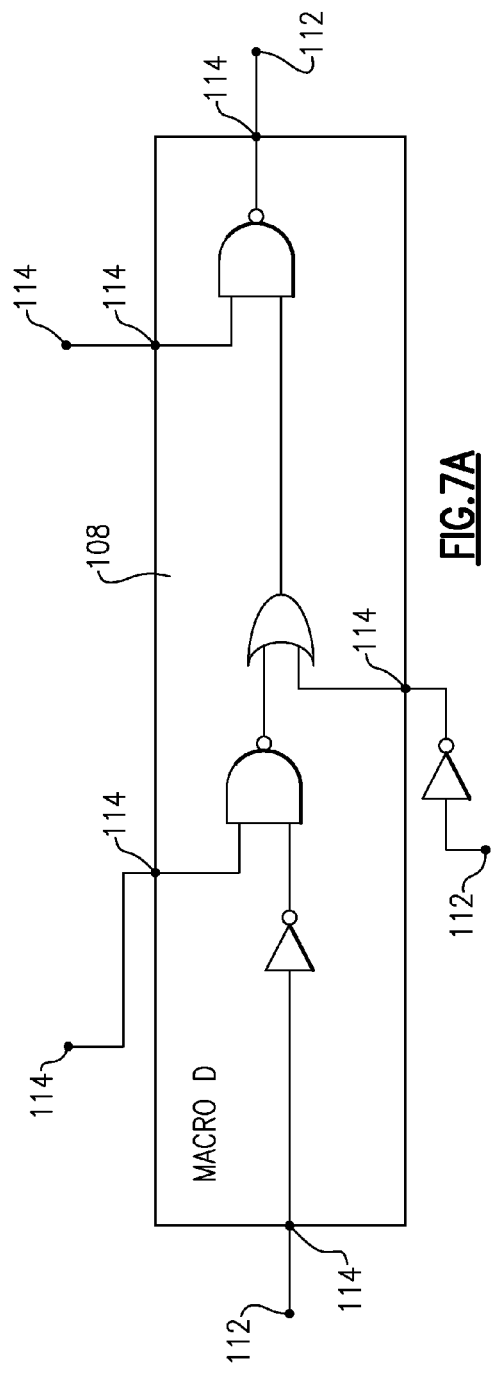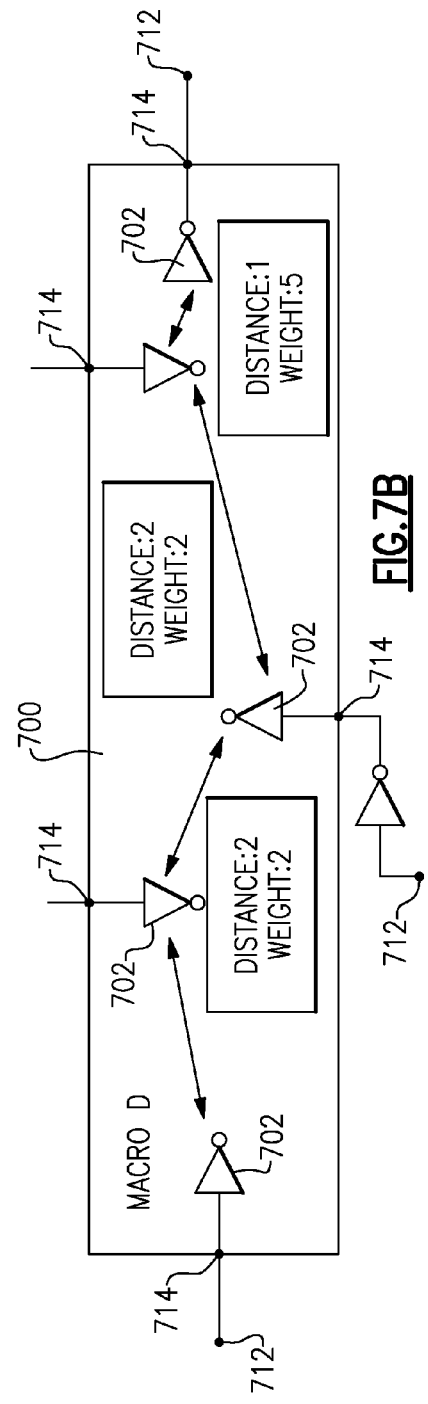

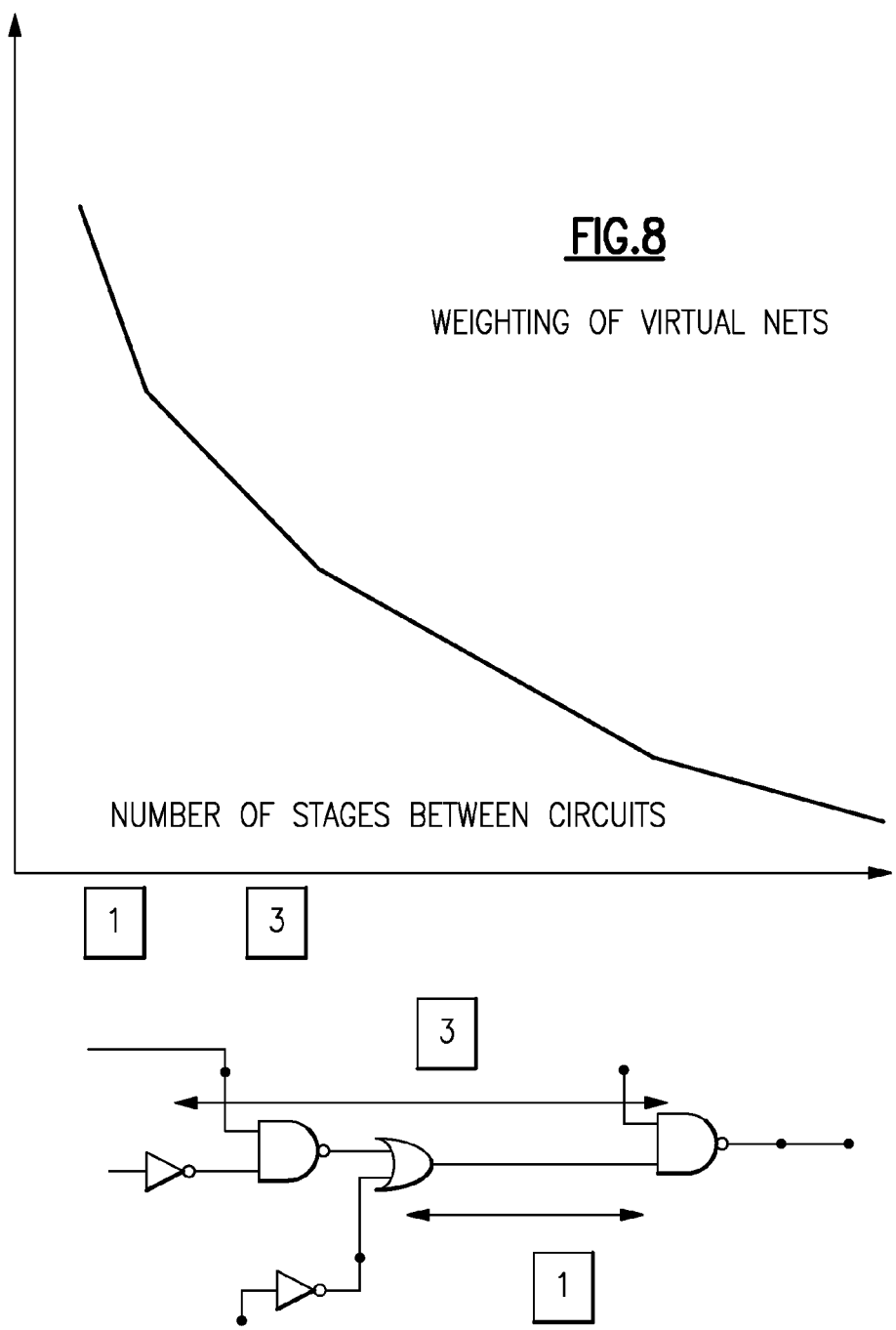

CIRCUIT MACRO PLACEMENT USING MACRO ASPECT RATIO BASED ON PORTS

TECHNICAL FIELD

The present invention relates to the placement and routing of electronic circuit designs for integrated circuits, and, more specifically, to an improved computer-implemented method to create a legal placement of random logic macros of an electronic circuit design, wherein said macros can have a fixed or a modifiable outline and wherein the outline of a macro with a modifiable outline is automatically adjusted.

BACKGROUND OF THE INVENTION

In a hierarchical design approach, the logic of an integrated circuit ("IC") or chip is partitioned into smaller portions that are assigned to predefined areas of the chip. These smaller design portions (which may comprise area, logic, interconnects and timing assertions) are typically referred to as macros. Usually, some logic will not be assigned to any macro. This logic is considered as being on the top level of the hierarchy. It may well be that the hierarchy is nested and a chip is partitioned into one or more units and each unit is partitioned into one or more macros. The top level is typically referred to as a "unit" and the lower level(s) as "macros".

A port of a macro is the point (or small area) at which the internal and external signals are connected to each other. There are some guidelines from the design team on which ports should be close to each other. The size of the macro as well as the x- and y-dimension of the macro outlines are given and assumed to be fixed. During unit/chip placement these fixed macro outlines are moved around to find the best legal location non-overlapping and with minimum netlength between ports. Additional unit/chip blockages allow not all possible placements and lead to longer netlength.

SUMMARY

According to one embodiment of the present invention, a method and a corresponding computer program and a corresponding computer program product to create a legal placement of random logic macros of an electronic circuit design, wherein said macros are categorized in macros with a fixed or a modifiable outline and wherein the outline of a macro with a modifiable outline is automatically adjusted, wherein the adjustment uses at least one of the following criteria:
macro port weights;
macro port ordering;
macro rapport constraints;
macro logic depth.

The invention allows improving macro utilization, package density of macros on the unit level, and path length. This offers cost reduction on the chip level and performance improvements for electronic circuits.

BRIEF DESCRIPTION OF THE DRAWINGS

FIG. 7, including FIGS. 7A and 7B, illustrates the distance and weight assigned to the connection between virtual inverters within a macro of FIG. 4;

FIG. 8 illustrates an example of the weighting of the virtual nets of FIG. 7;

DETAILED DESCRIPTION

Port Assignment in Hierarchical Designs by Abstracting Macro Logic

Figure 1:
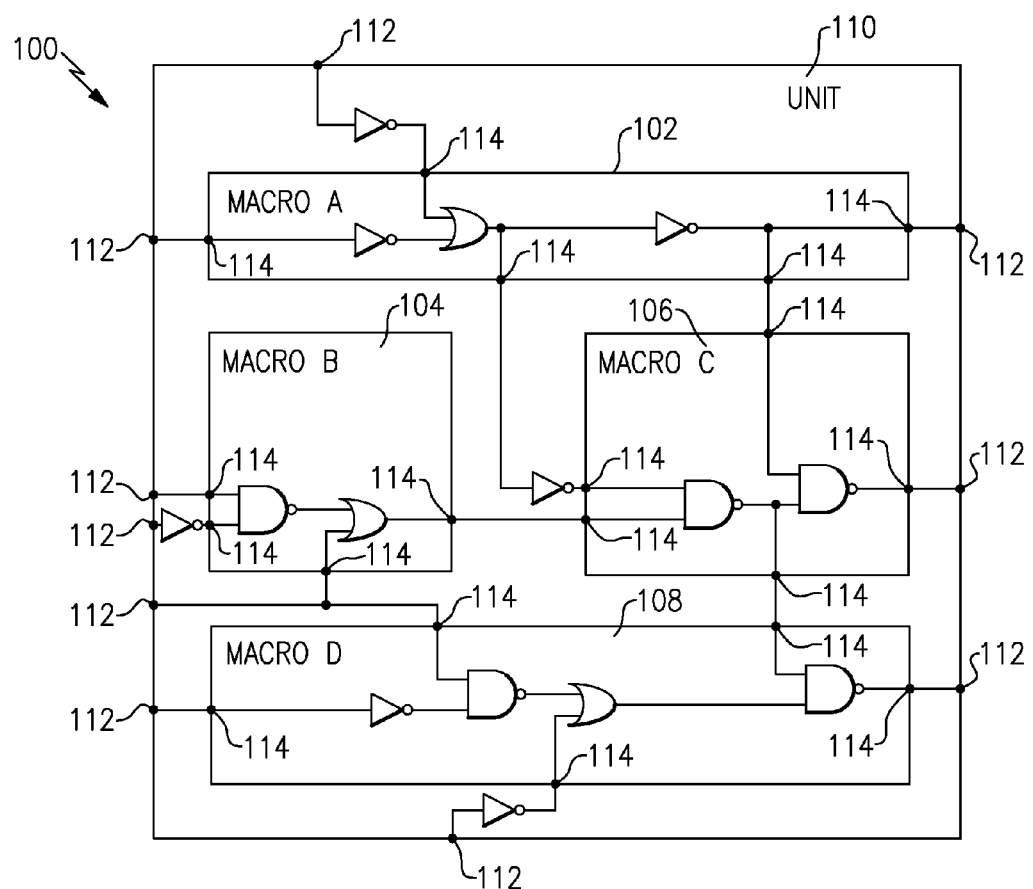
FIG. 1 is a block diagram of an IC or chip having a top level unit and several lower level macros.

Referring to the block diagram of FIG. 1, in a hierarchical design approach, the logic of an IC or chip 100 is partitioned into smaller portions that are assigned to predefined areas of the chip. These smaller design portions (which may comprise area, logic, interconnects, timing assertions, etc.) are typically referred to as macros. Four macros ("Macro A"-"Macro D") 102-108 are illustrated in FIG. 1, wherein each macro 102-108 is shown containing various combinational logic circuits or components. The macros 102-108 also may contain sequential logic. Usually, some logic will not be assigned to any macro. This logic is considered as being on the top level of the hierarchy. It may well be that the hierarchy is nested and a chip is partitioned into one or more units and each unit is partitioned into one or more macros. The top level is typically referred to as a "unit" and the lower level(s) as "macros". One unit 110 is illustrated in FIG. 1. Also illustrated is a plurality of input/output ports 112 for the unit or chip and a plurality of ports 114 for the various macros 102-108.

An embodiment of the present invention uses a method for port assignment by abstracting local connections in the macro when performing port assignment for the macro. This is done for netlength, congestion as well as timing. Specifically the internal netlist of the macro is abstracted such that the optimization of the port connections can be performed in a relatively efficient manner. Three levels of abstractions are used.

Figure 2:
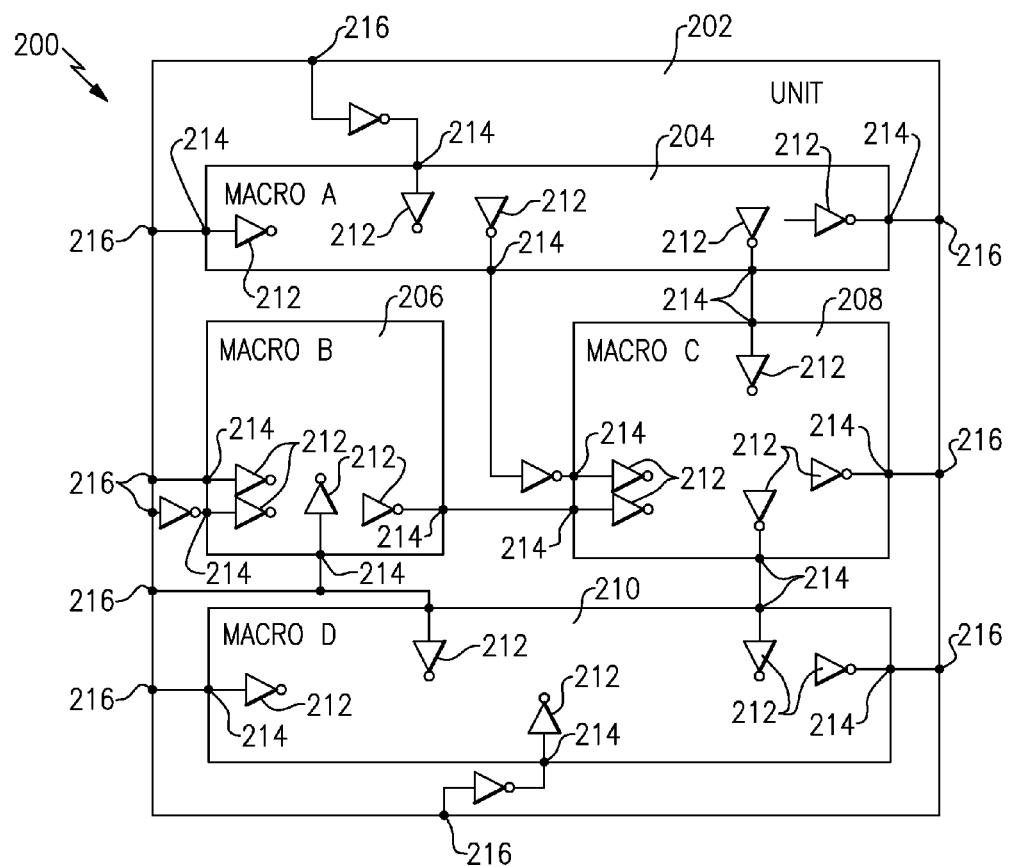
FIG. 2 is a block diagram of an IC or chip having a top level unit and several lower level macros with port assignments in accordance with a first abstraction.

Referring to FIG. 2, there illustrated is a block diagram an IC or chip 200 having a top level unit 202 and several lower level macros 204-210 with port assignments in accordance with a first abstraction used in an embodiment of the invention. Each input and output circuit (FIG. 1) for each macro 204-210 is replaced by a circuit component which, in an embodiment, comprises an inverter circuit 212. However, the circuit components 212 may, in the alternative, comprise a buffer, a terminator, or a load book. The port assignment process now comprises placing or locating the entire logic (i.e., the unit 202 and the inverters 212 or other components in each of the macros 204-210) such that netlength and congestion are both minimized. Thus, this first abstraction optimizes the top level interconnect. The area or point where the signal wire enters or leaves the macro 204-210 is where the port location 214 is assigned for each macro 204-210. Also illustrated is a plurality of input/output ports or ports 216 for the unit or chip 202.

Figure 3:
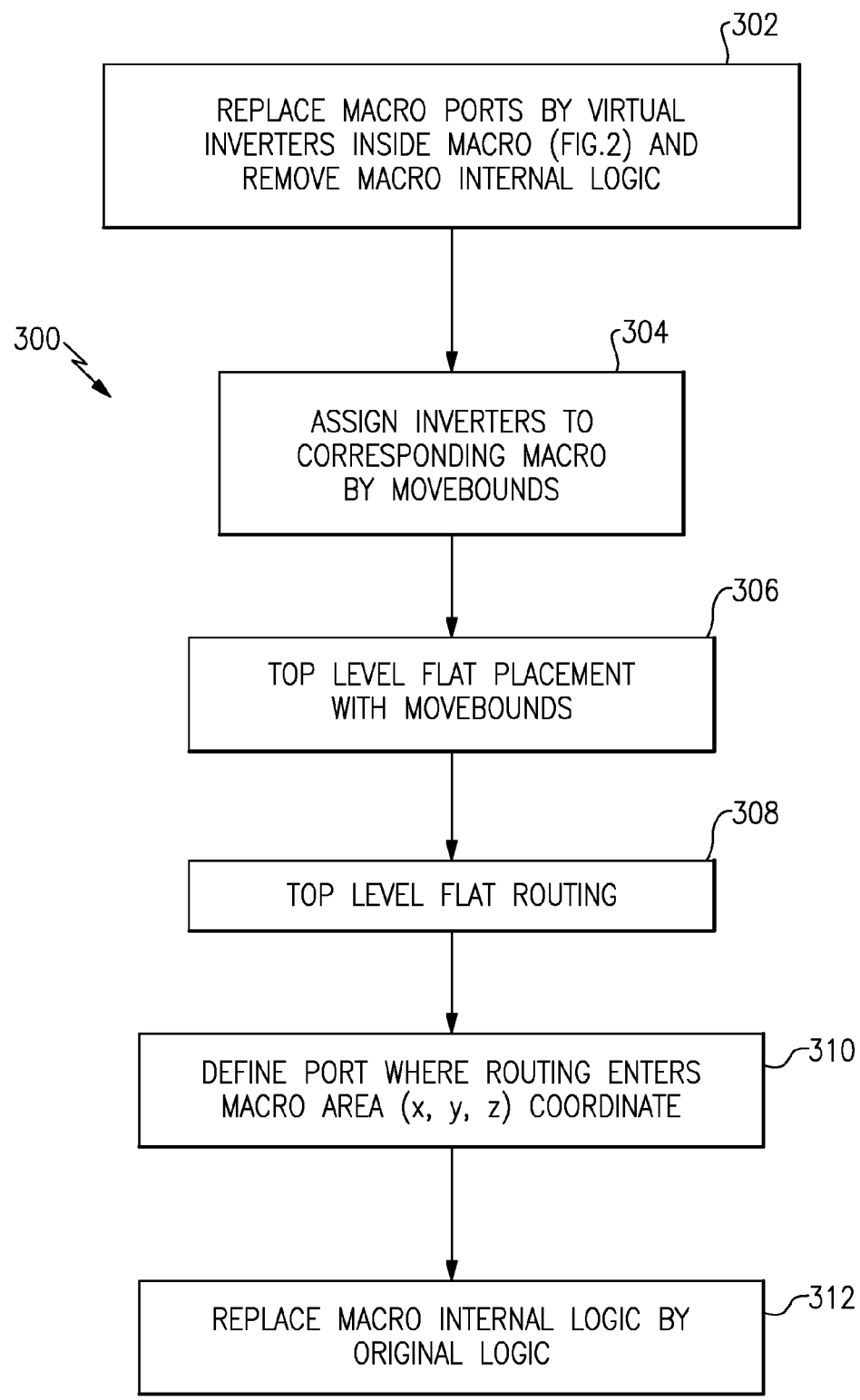
FIG. 3 is a flow diagram of the steps in a method for the first abstraction of FIG. 2 in which the top level interconnects are optimized.

The flow diagram of FIG. 3 illustrates the steps in a method 300 for the first abstraction in which the top level interconnects are optimized. In the method 300 of FIG. 3, in a step 302 the macro ports are replaced by the virtual inverters 212 (FIG. 2) inside each macro 204-210. Also, the internal logic within each macro 204-210 (FIG. 1) is removed. The inverters 212 are then assigned to the corresponding macros 204-210 by movebounds in a step 304. Next, a flat placement of the entire abstracted logic with movebounds is carried out in a step 306, and then the top level flat routing occurs in a step 308. Then, a step 310 takes place which defines the ports where routing enters the macro area in x, y, z coordinates. Next, the macro internal logic is replaced in a step 312 by the original macro logic.

Figure 4:
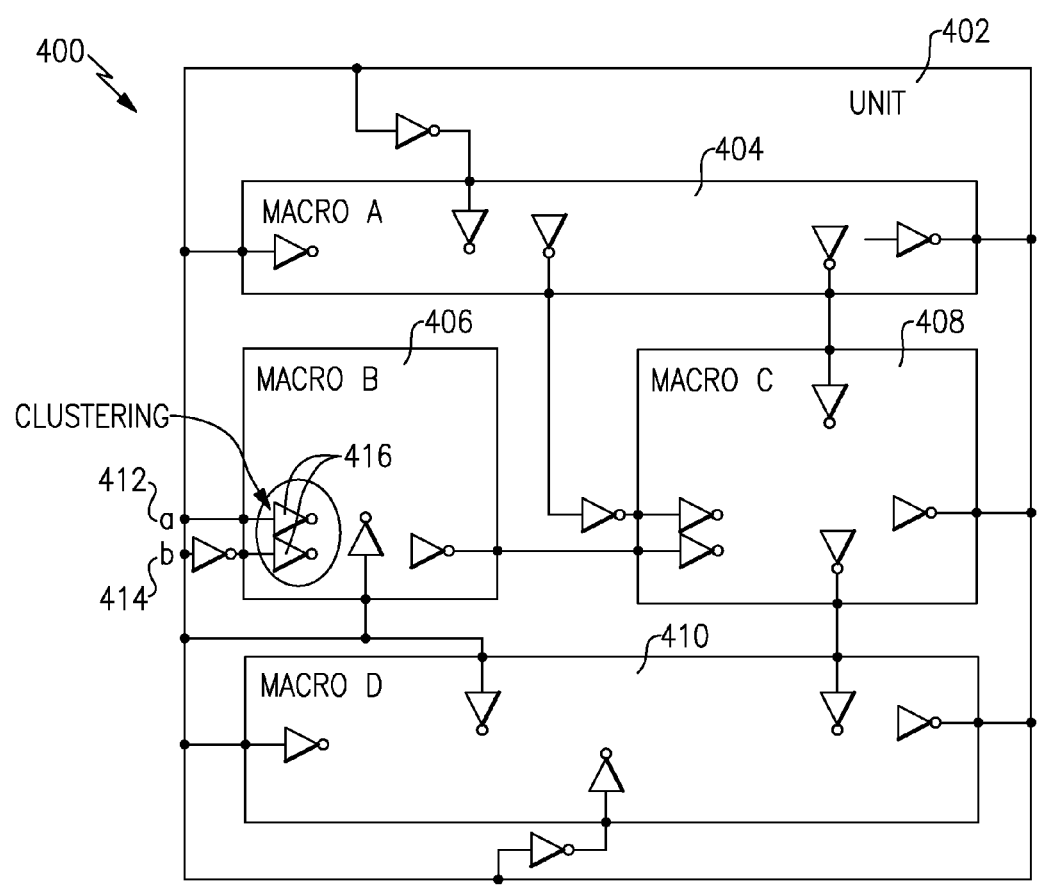
FIG. 4 is a block diagram of a second abstraction.
Figure 5:
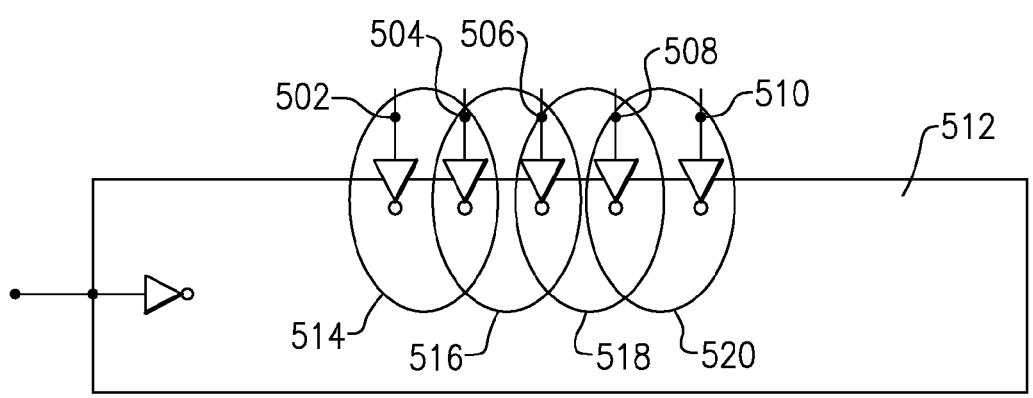
FIG. 5 illustrates a clustering approach of splitting a sequence of n ports within a macro into n−1 pair-wise clusters of ports.

Referring to FIG. 4, there illustrated is a block diagram of an IC 400 having a top level unit 402 and several lower level macros 404-410 with port assignments in accordance with a second abstraction used in an embodiment of the invention. The first abstraction of FIG. 2 does not consider the fact that port (a) 412 and port (b) 414 in FIG. 4 may be located relatively close to each other as these two ports 412-414 are connected to the same circuit within Macro B 406. This can be handled by any clustering method during the placement step. A typical clustering method is to add a new artificial connection between the two inverters 416 connected to port (a) 412 and port (b) 414. Also, a relatively high weight may be placed on the connection (e.g., a weight of 10 means that the placement minimizing the overall netlength weights this connection 10 times higher than a connection or net without a special weight assigned). These connections may either be: (1) given by the logic designer, for example, to cluster multiple-bit signal busses, which is the case when the macro logic is not available yet; or (2) derived from a previous logic analysis step of all the macros counting how many circuits are in between the two ports 412-414, where in general, the lower this number the higher the weight to be chosen. The clustering approach may also be used to guide the port assignment to a certain sequencing of the ports. In these cases the relative ordering is important but mirroring may be allowed to optimize the global connections. This may be obtained by splitting a sequence of n ports 502-510 within a macro 512 into n−1 pair-wise clusters 514-520 of ports as shown in FIG. 5.

Figure 6:
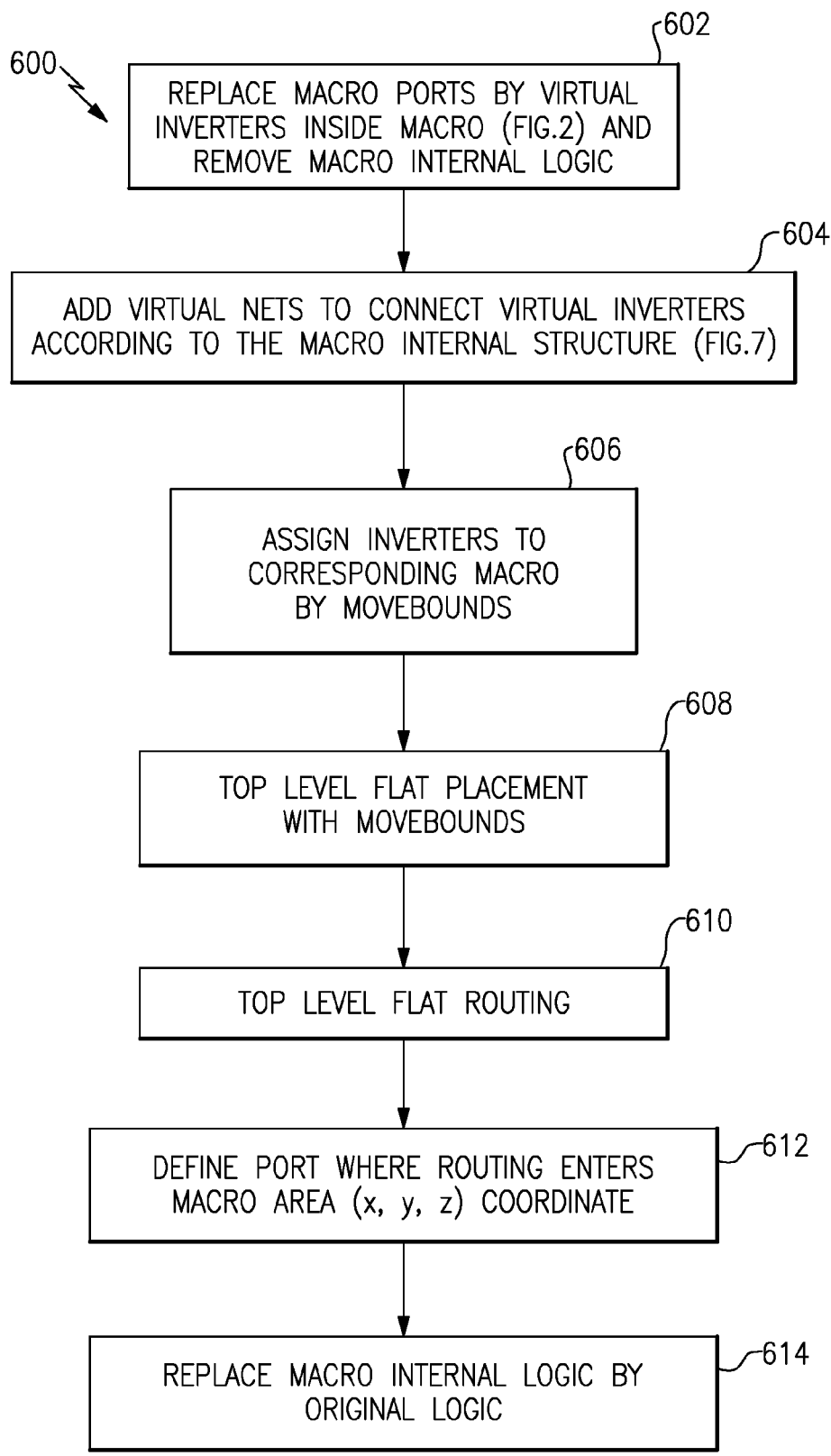
FIG. 6 is a flow diagram of the steps in a method for the second abstraction of FIG. 4 in which both the top level and the macro interconnects are optimized.

The flow diagram of FIG. 6 illustrates the steps in a method 600 for the second abstraction used in an embodiment of the invention in which both the top level interconnects and the macro interconnects are optimized. The method 600 of FIG. 6 is similar to the method 300 of FIG. 3, with the exception of the addition of a step 604 in which virtual nets are added to connect the virtual inverters according to the macro internal structure. For example, see FIG. 7 in which Macro D 108 from FIG. 1 is shown in FIG. 7A above the abstracted Macro D 700 in FIG. 7B in which the virtual inverters 702 or other components within Macro D 700 have a distance and a weight assigned to the connection between these inverters 702. An example of the weighting of the virtual nets is illustrated in FIG. 8. This figure illustrates that the weighting is typically given by the number of stages (i.e., distance) between ports of a macro.

Figure 9:
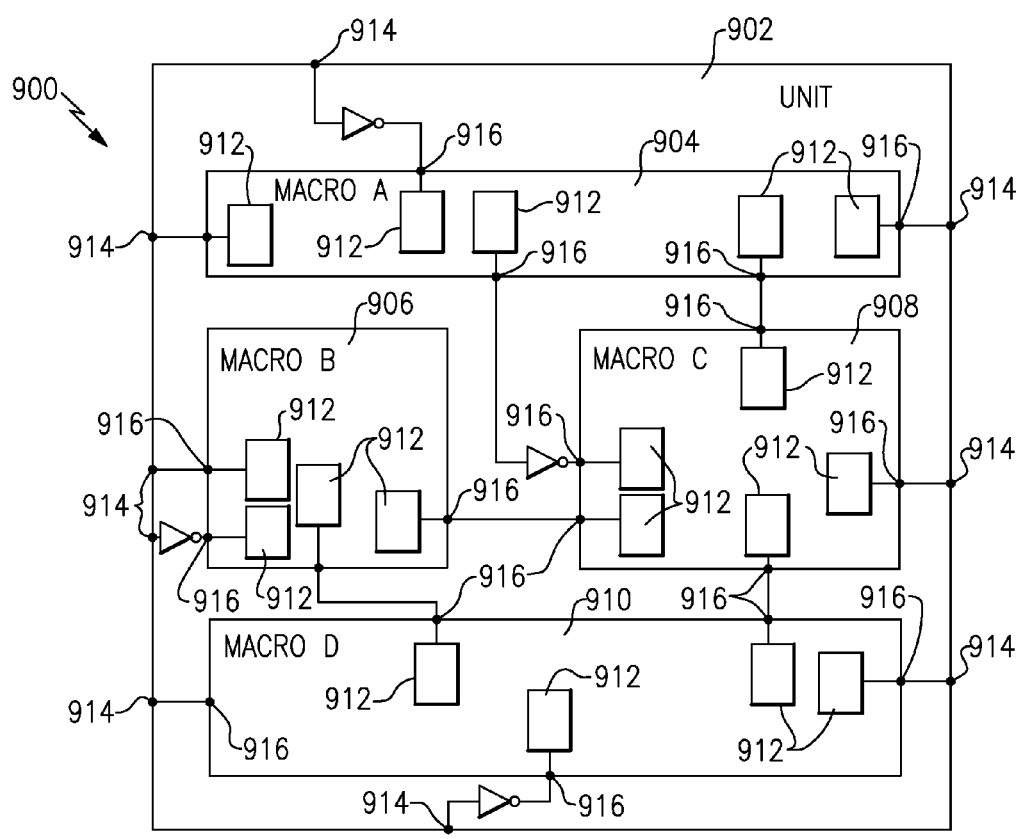
FIG. 9 is a block diagram of a third abstraction.

Referring to FIG. 9, there illustrated is a block diagram of an IC 900 having a top level unit 902 and several lower level macros 904-910 with port assignments in accordance with a third abstraction used in an embodiment of the invention. The first and second abstractions described hereinabove do not permit timing-driven optimization port assignment. This is because the removal of the macro logic breaks the timing paths as seen by static timing analysis ("STA") or similar tools. A standard design practice is to latch-bound macros for high frequency designs. Within this abstraction the inverters utilized within the first and second abstractions may be replaced by clocked latches or flip-flops 912, which connect to clock signals such that STA tools can now time between the unit (or chip) input/output ports 914 and the macros. Each timing path starts and ends at either an input/output port or port 914 or a latch 912. Clock overrides may be used to account for logic stages between the latches 912 and the ports 916 that exist in the real logic of the macro 904-910.

Figure 10:
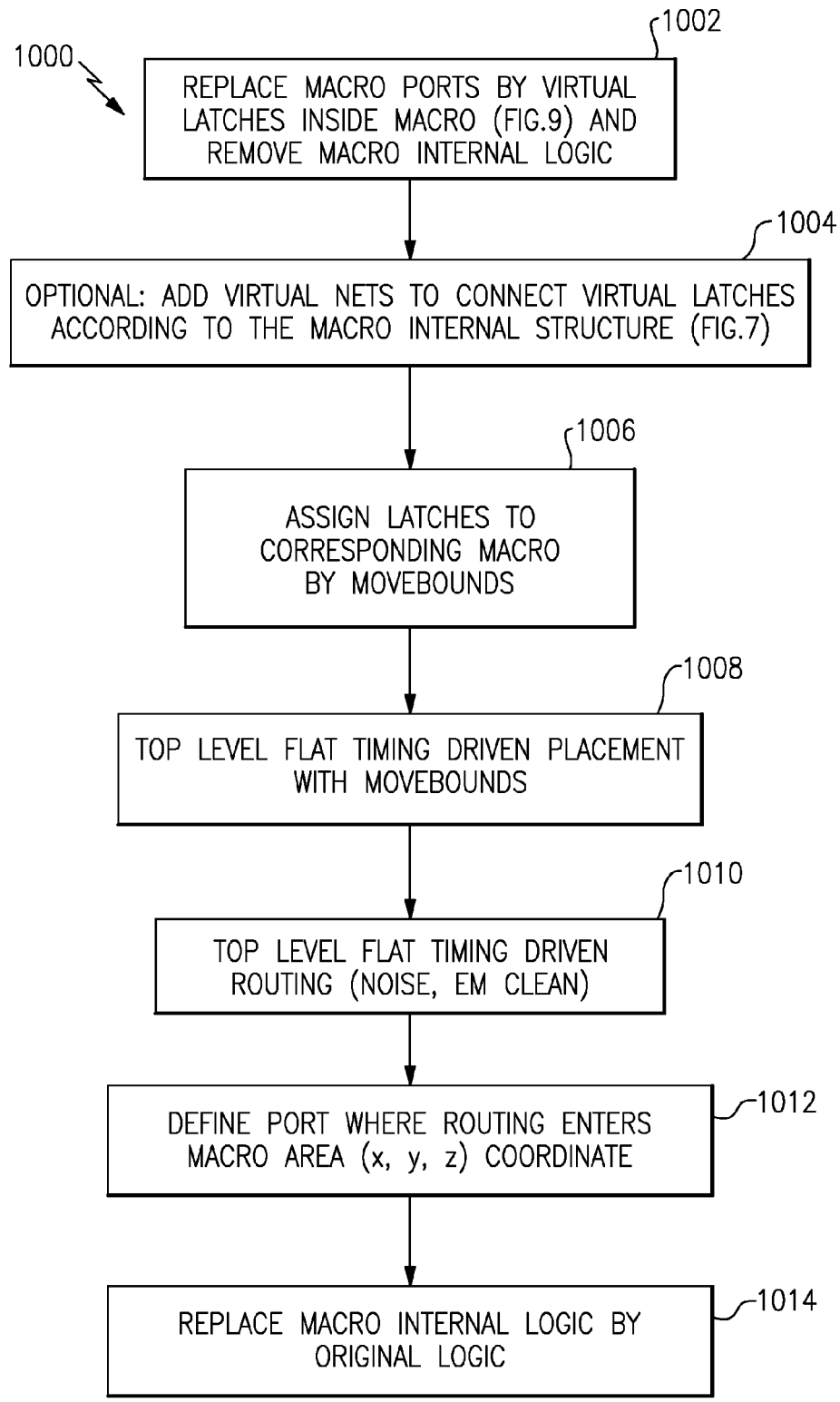
FIG. 10 is a flow diagram of the steps in a method for the third abstraction of FIG. 9 in which the top level timing is optimized.

The flow diagram of FIG. 10 illustrates the steps in a method 1000 for the third abstraction used in an embodiment of the invention in which the top level timing is optimized. In the method 1000 of FIG. 10, in a step 1002 the macro ports are replaced by the virtual latches 912 (FIG. 9) inside each macro 904-910. Also, the internal logic within each macro 904-910 (FIG. 1) is removed. In an optional step 1004, the virtual nets are added to connect the virtual latches 912 according to the macro internal structure (FIG. 7). The latches 912 are then assigned to the corresponding macros 904-910 by movebounds in a step 1006. Next, a flat timing driven placement of the entire abstracted logic with movebounds is carried out in a step 1008, and then the top level flat timing driven routing occurs in a step 1010. Then, a step 1012 takes place which defines the ports where routing enters the macro area in x, y, z coordinates. Next, the macro internal logic is replaced in a step 1014 by the original macro logic.

Modifiable Macros

Figure 12:
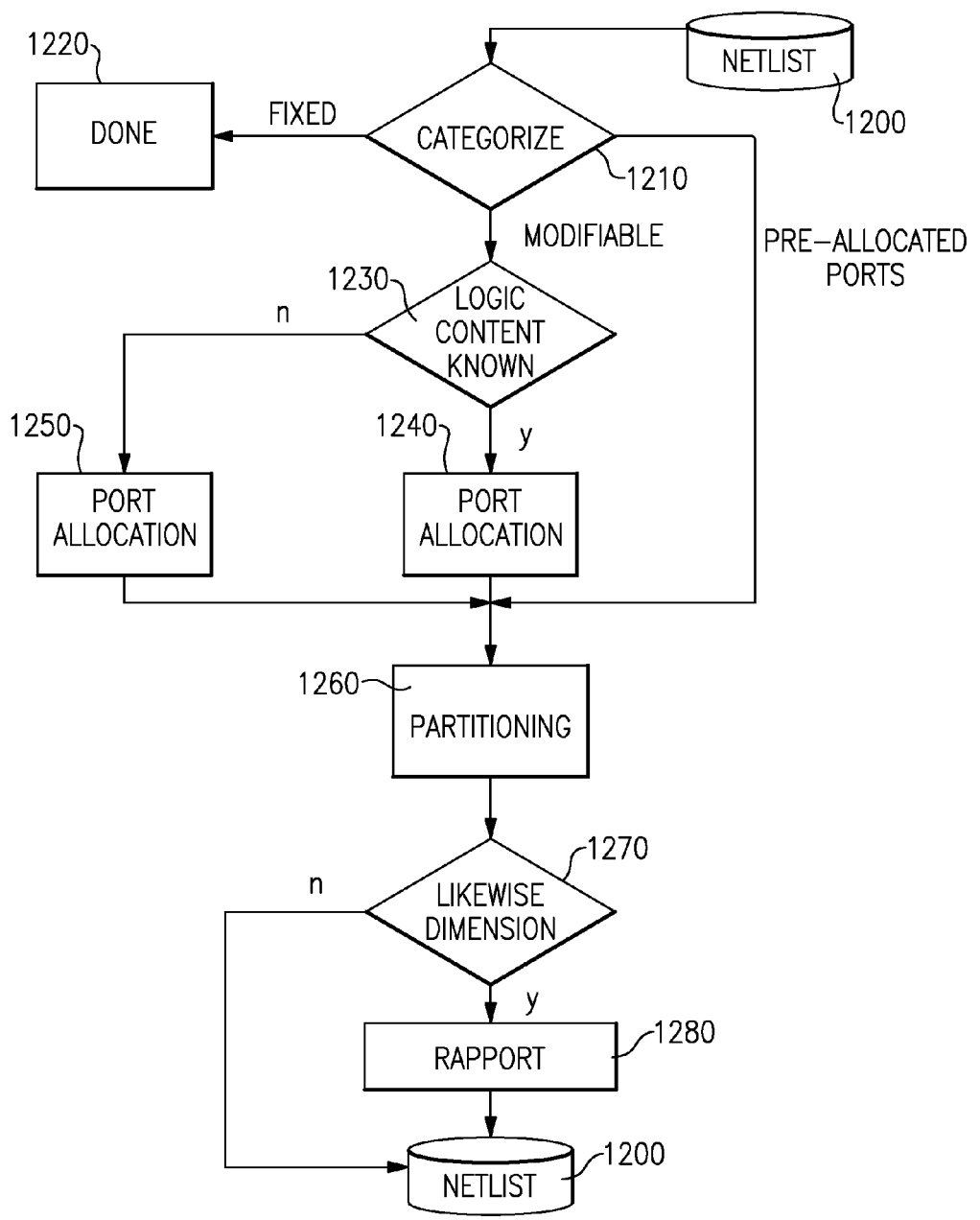
FIG. 12 is a flow diagram of the steps in a method in accordance with the present invention.

The flow diagram of FIG. 12 illustrates the steps in a method in accordance with the invention. Random logic macros and/or custom macros are stored in a netlist 1200. The netlist 1200 is a hierarchical netlist of a design of an electronic circuit on the gate level and comprises placement information for the macros such as their size and the position of the ports. Macros like arrays, register files and custom macros are always fixed in size, boundary and ports and attributed by the designers as none-modifiable, based on constraints like dataflow, placement location or area allocation. Other macros are tagged by the designer with one dimension of the boundary fixed based on known constraints like dataflow, placement location and area allocation. All other macros are modifiable in all dimensions.

In step 1210 a macro will be selected from the netlist 1200 and categorized. If the macro was categorized as a macro with fixed boundaries, then the processing of this macro will be finished in step 1220. If the macro was categorized as a macro with modifiable outline and pre-allocated ports, then the processing of the macro continues with step 1260. If the macro was categorized as a macro with modifiable boundaries, then it will be determined in step 1230, if the logic content of this macro is already stored in the netlist 1200. If it is stored, then a special port allocation method will be performed for this macro in step 1240. Otherwise a different port allocation method will be performed for this macro in step 1250.

The special port allocation methods performed in steps 1240 and 1250 use the port assignment methods described above to define the ports to the edges of the macro. Especially, for step 1250 the method shown in FIG. 4 can be used. Once the ports are defined, the port allocation is based on the distance weight between ports and signal names in the macro, which is based on their distance as long as the macro logic content is not known for the directional size. This port allocation approach is used in step 1250. For step 1240 the port allocation is based on distance weight, port/signal names, same gate port staggering, and input to output distance weight.

Figure 14:
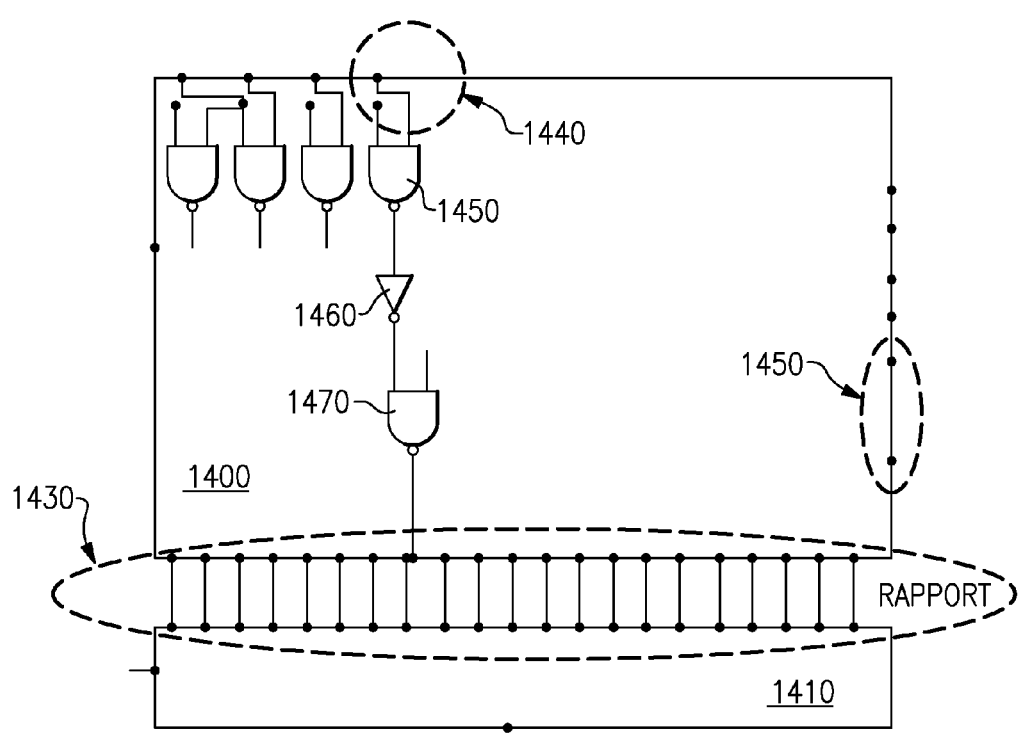
FIG. 14 is a block diagram illustrating the port ordering in accordance to the invention.

The port allocation is illustrated in FIG. 14, where a large macro 1400 and a small macro 1410 are shown. Macro 1400 and macro 1410 have a modifiable boundary and are connected to each other via a number of ports as shown in the area 1430. The large macro 1400 forces its port assignment onto the smaller macro 1410 in one direction within the area 1430. This relationship is also called rapport. Generally, large macros force their port assignment onto smaller neighboring connected macros.

If the logic content of the macro 1400 is known, then it is possible to determine, which ports on the input stage are connected to the same gate of the macro 1400. In FIG. 14, the ports in the area 1440 are in the input stage of the macro 1400 and connected to the same gate 1450. This way it is possible to establish a port staggering at the input stage of the macro 1400 by staggering all ports that are connected to the same gates.

For each of these ports it is possible to count the number of stages with logic elements between the input and output stage of the macro 1400. This is also called the logic depth. For the staggered ports in the area 1440 the logic depth is 3 as there are three logic elements between the input and the output stage: the logic elements 1450, 1460, and 1470. This logic depth can be used as a measure for the orthogonal size of the macro 1400.

In case the logic content for the macro 1400 is not known, then the ports are allocated based on the distance weight between input ports and signal names. For example, the distance between the ports in the area 1450 is 2.

Figure 13:
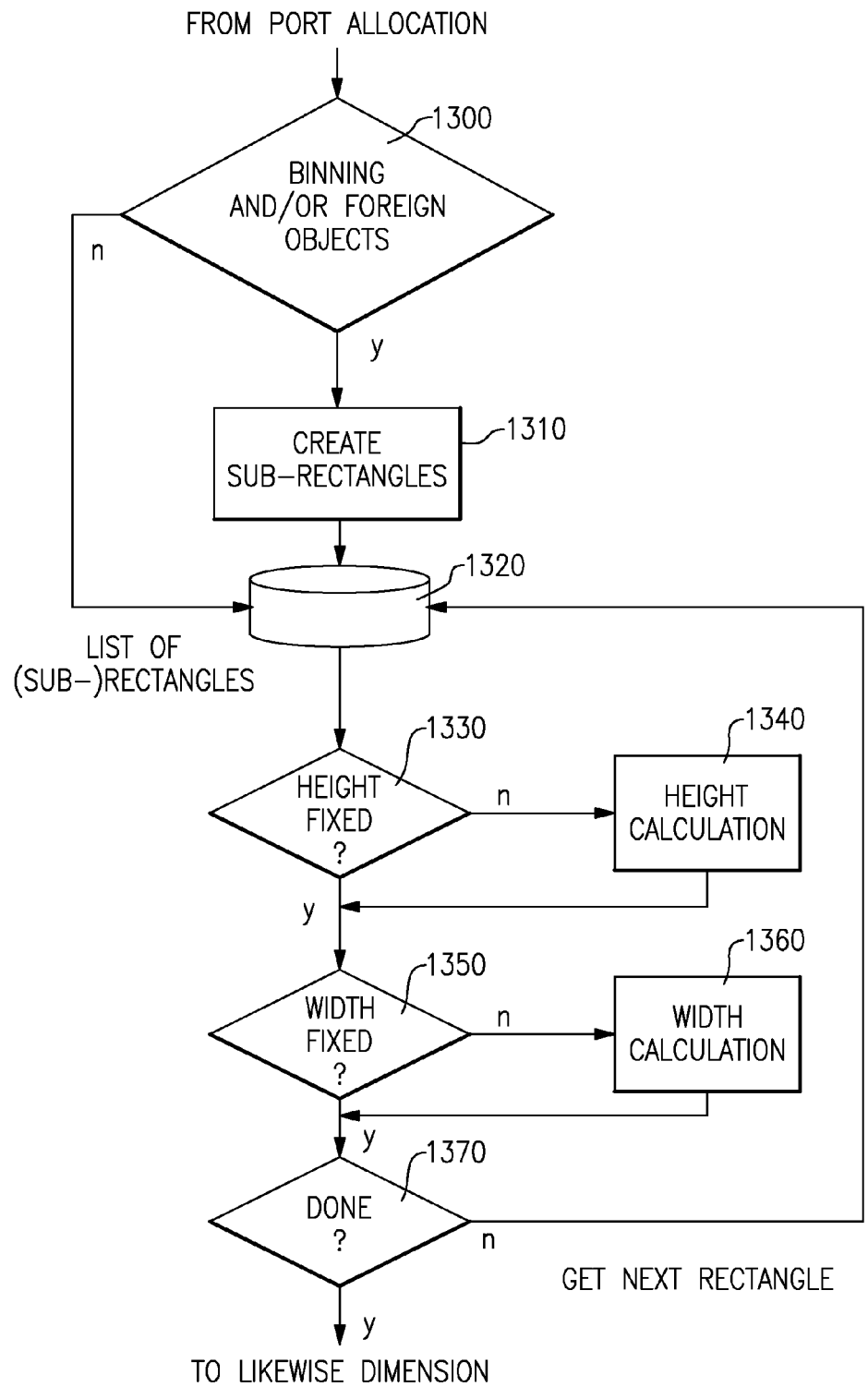
FIG. 13 is a flow diagram of the steps in a partitioning method in accordance with the present invention.

When steps 1240 or 1250 in FIG. 12 are completed, then a separate partitioning method will be performed with the macro in step 1260. This partitioning method is illustrated in FIG. 13. The method in FIG. 12 continues with step 1270 of FIG. 12. Step 1270 will determine if the dimension of the macro as defined by the partitioning method of FIG. 13 in step 1260 is likewise with the dimension of a large neighbor macro with fixed outline and given port sequence. If this is not the case, then the modified macro will replace the original macro in the netlist 1200. Otherwise, the ports from the other macro in vicinity get stamped onto the macro (rapport) in step 1280. The resulting modifications to the macro are then finally stored in the netlist 1200 again.

Figure 15:
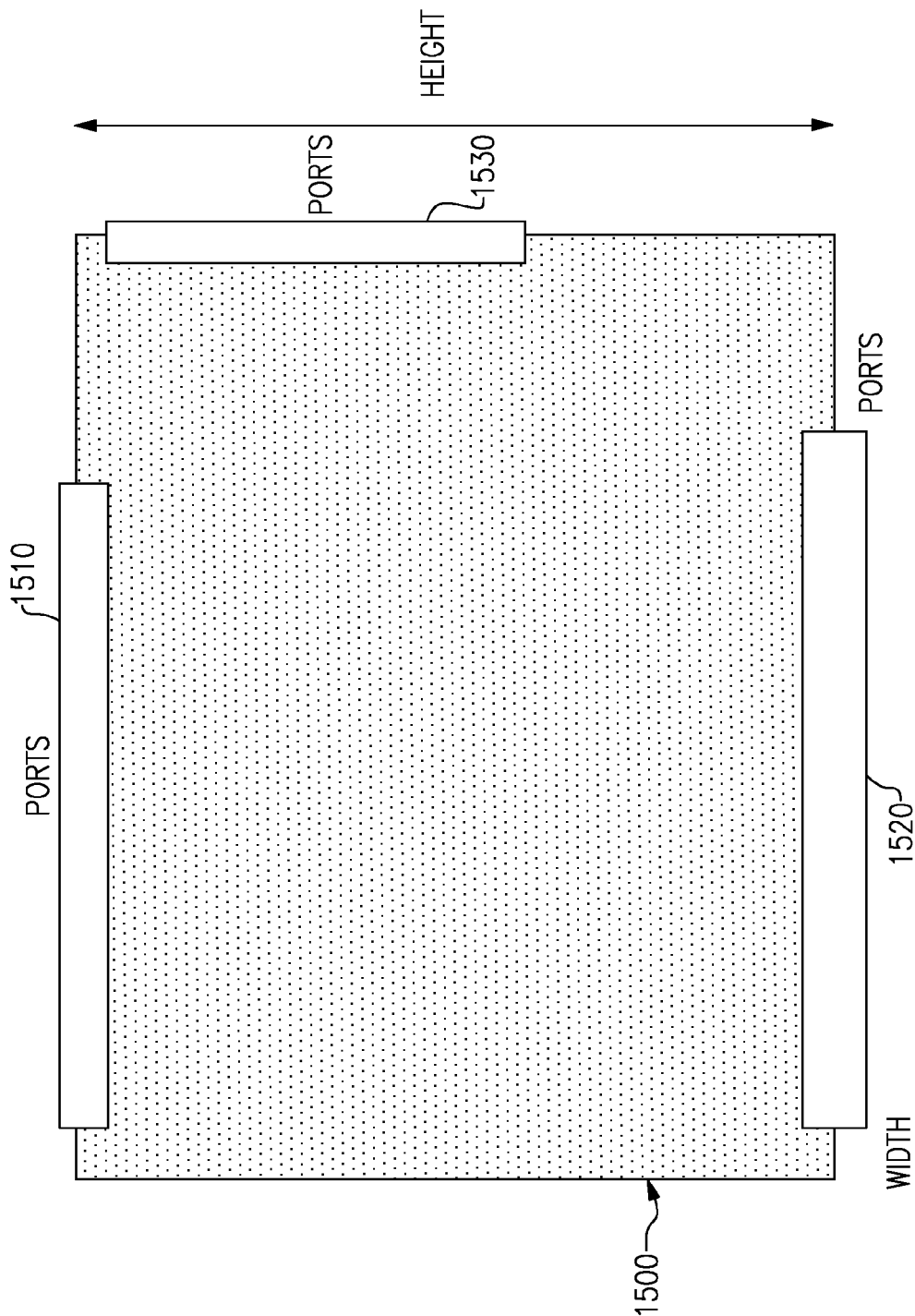
FIG. 15 is a block diagram illustrating a vertical data flow dominated macro.

FIG. 15 illustrates a macro 1500, which is dominated by a vertical data flow. This domination is caused by the horizontally allocated ports 1510 and 1520, which dominate in relation to the vertically allocated ports 1530. The area consumed by this macro on the IC or chip, its height and width are calculated as follows:

$$\text{Area} = \frac{\text{Logic\_Area}}{\text{Utilization}}$$

$$\text{Height} = \min(f_1(\text{logic\_depth}), f_2(\text{number\_of\_ports\_in\_y\_direction}))$$

$$\text{Width} = \min\left(\frac{\text{Area}}{\text{Height}}, f_2(\text{number\_of\_ports\_in\_x\_direction})\right)$$

For example, the functions $f_1, f_2$ can be given as $$f_1 = a + b \cdot \text{number\_of\_logic\_stages}$$

$$f_2 = a' + b' \cdot \text{number\_of\_ports}$$

with technology dependent constants a, a', b, b'. Other implementations for the functions $f_1, f_2$ are possible. The calculated width and height must be within the following bounds for a given parameter $\alpha$:

$$\alpha < 1$$

$$\sqrt{\alpha \cdot \text{Area}} \leq \text{Height} \leq \sqrt{\frac{1}{\alpha} \cdot \text{Area}}$$

$$\sqrt{\alpha \cdot \text{Area}} \leq \text{Width} \leq \sqrt{\frac{1}{\alpha} \cdot \text{Area}}$$

For a macro which is dominated by a horizontal data flow, the calculations are likewise. For a macro which is not clearly dominated by a horizontal or a vertical data flow (orthogonal data flow, combined horizontal and vertical data flow), the maximum dimension for each direction is calculated and bounds are used to limit the aspect ratio for the macro.

The partitioning method of step 1260 is illustrated in FIG. 13. After the completion of step 1210, or step 1240, or step 1250 (port allocation) respectively, then in step 1300 it will be determined, if a polygonal macro outline can be enforced for the macro by foreign objects or if the polygonal macro outline can be optimized for macro area based on logic depth binning. If this is not possible, then a list 1320 of rectangles will be created in step 1300, which contains a single rectangle only, which comprises the macro. Otherwise the list 1320 will be created in step 1310 such that it also contains sub-rectangles in addition to the rectangle. For both options of using either foreign objects or logic depth binning the macro may be partitioned into two or more rectangles in order to give it a polygonal outline.

Figure 16:
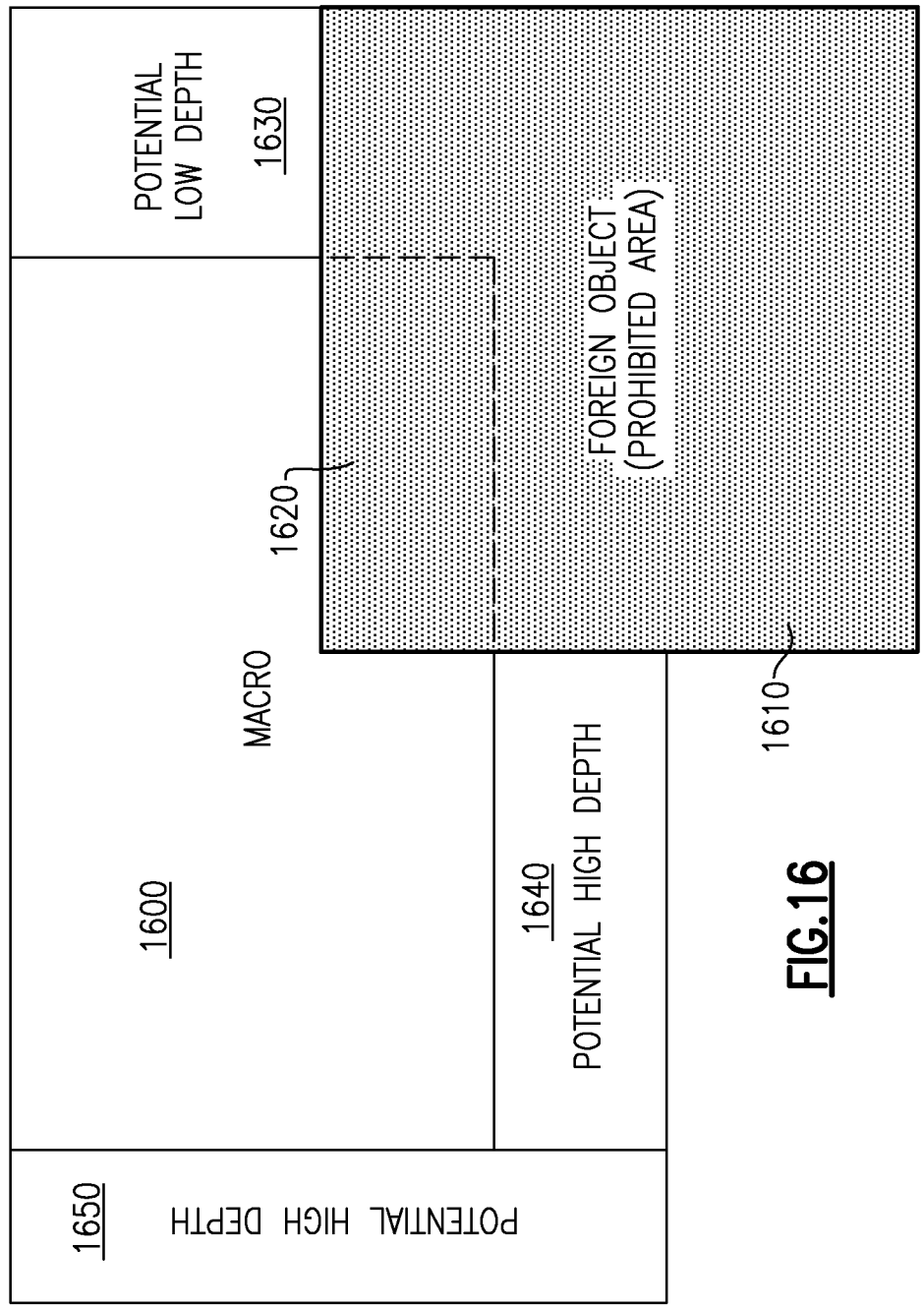
FIG. 16 is a block diagram illustrating foreign objects used in accordance with the invention.

The interaction with foreign objects is illustrated in FIG. 16. A macro 1600 collides with a foreign object 1610, which represents an area, which is prohibited for the macro 1600. The macro 1600 and the foreign object overlap in the area 1620. Therefore, this area 1620 needs to be cutout from the macro 1600. This is achieved by adjusting the outline of the macro 1600 in order to preserve the area 1620 from the macro 1600. However, the space missing to the preservation of the area 1620 needs to be compensated by using other areas. The areas 1630, 1640, and 1650 can be used for the compensation. However, area 1630 is so small that it can only be used for circuitry with a rather low logic depth. But the areas 1640 and 1650 are large enough to be used for circuitry with higher logic depth.

Figure 17:
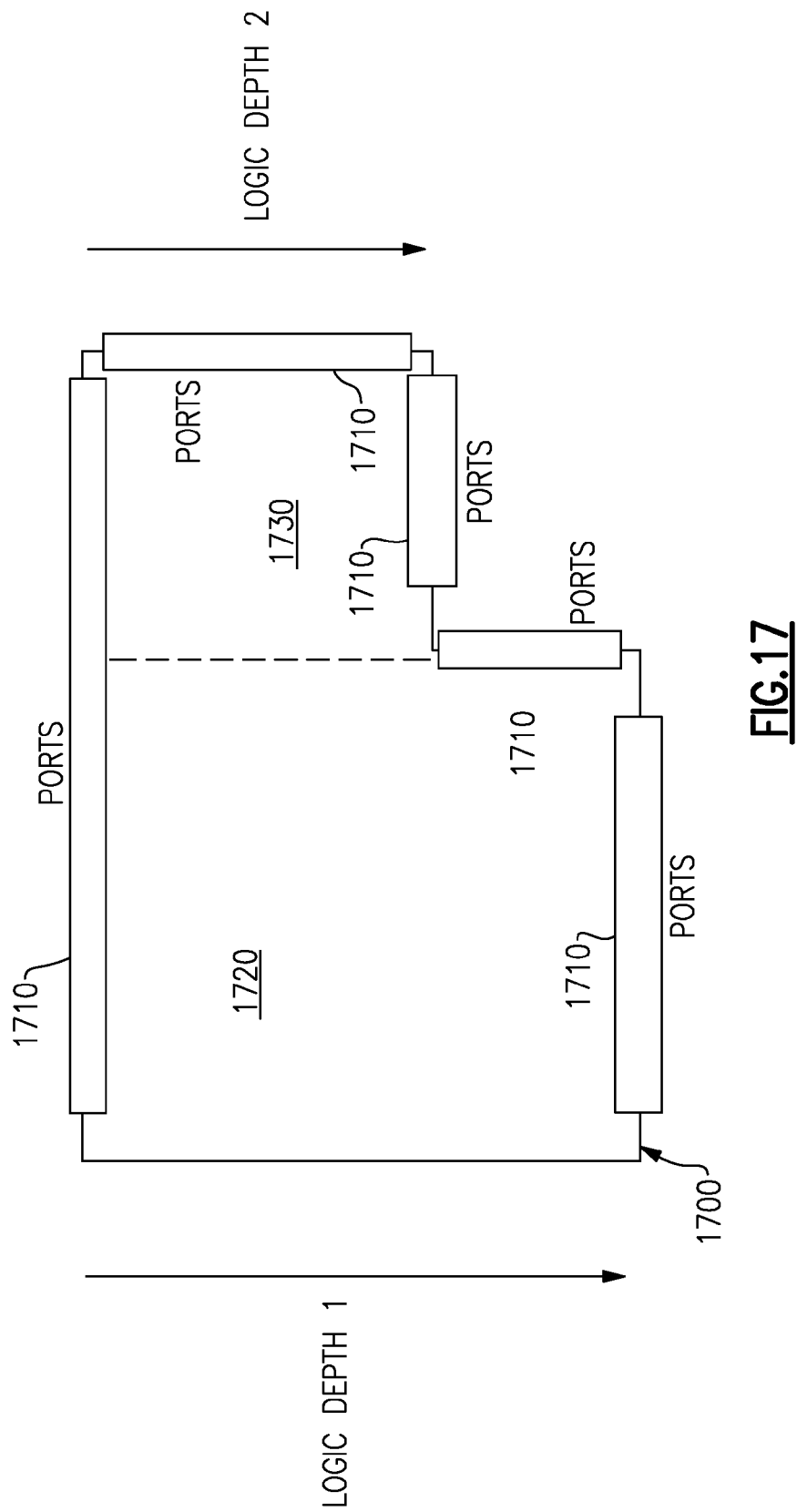
FIG. 17 is a block diagram illustrating logic depth binning in accordance with the invention.
Figure 18:
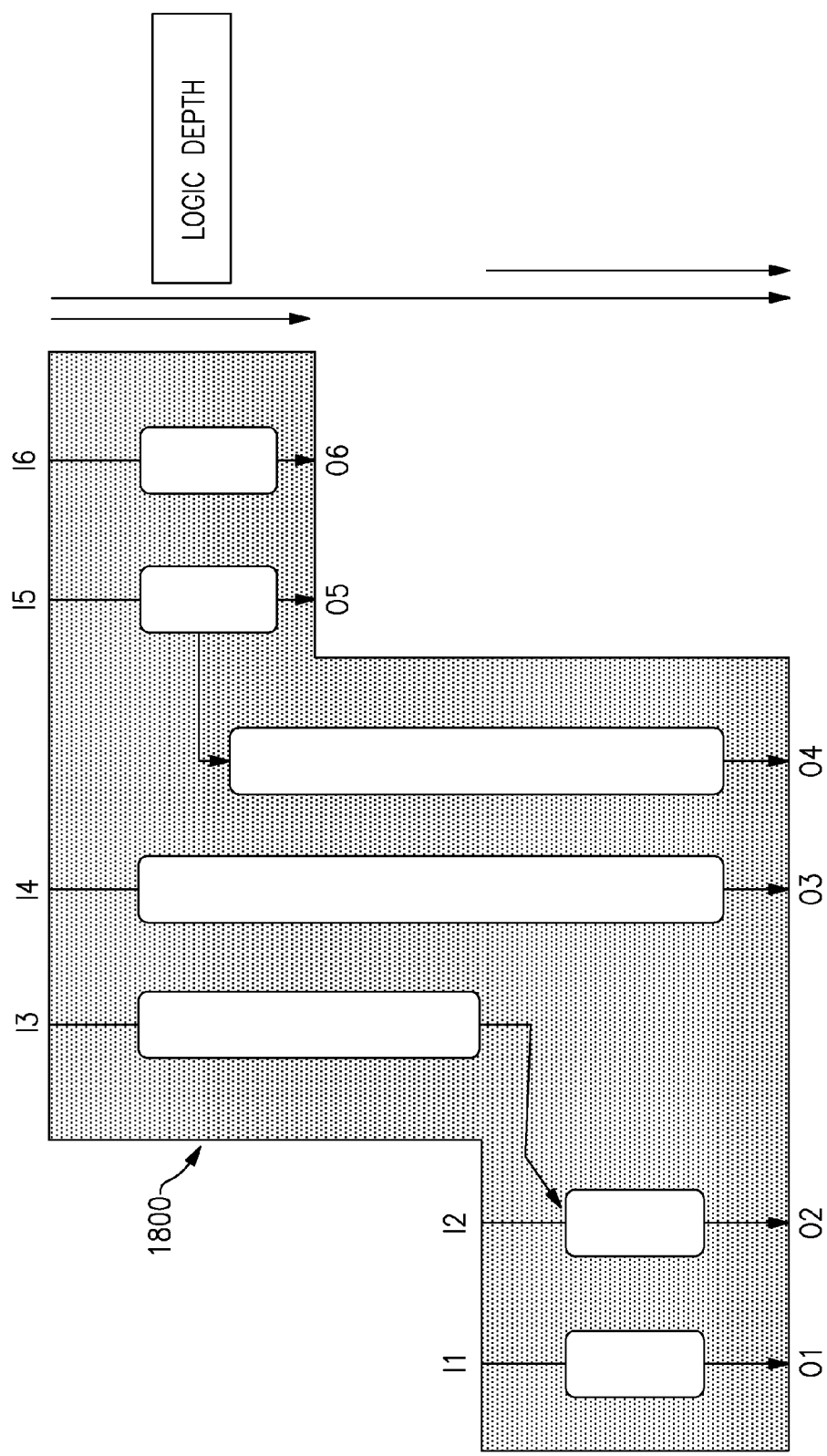
FIG. 18 is a block diagram illustrating logic depth binning based on cones from input ports to output ports accordance with the invention.

The logic depth binning is illustrated in FIG. 17. A macro 1700 has a polygonal shape and various ports 1710. For this macro 1700 two rectangles 1720 and 1730 are defined. These two rectangles 1720 and 1730 are defined such that they contain circuitry with a maximum logic depth each based on the cones of influence from input ports to output ports or vice versa. This is illustrated in FIG. 18. There is shown a macro 1800 with input ports I1, I2, I3, I4, I5, I6 and output ports O1, O2, O3, O4, O5, O6. Input port I1 is connected to the output port O1, I2 to O2, I3 to O2, I4 to O3, I5 to O5 and O4, and I6 to O6. This allows defining three rectangles for the macro 1800: a rectangle with input ports I1 and I2 and output ports O1 and O2, a rectangle with input ports I3, I4 and output ports O3 and O4, and a rectangle with input ports I5 and I6 and output ports O5 and O6.

Figure 19:
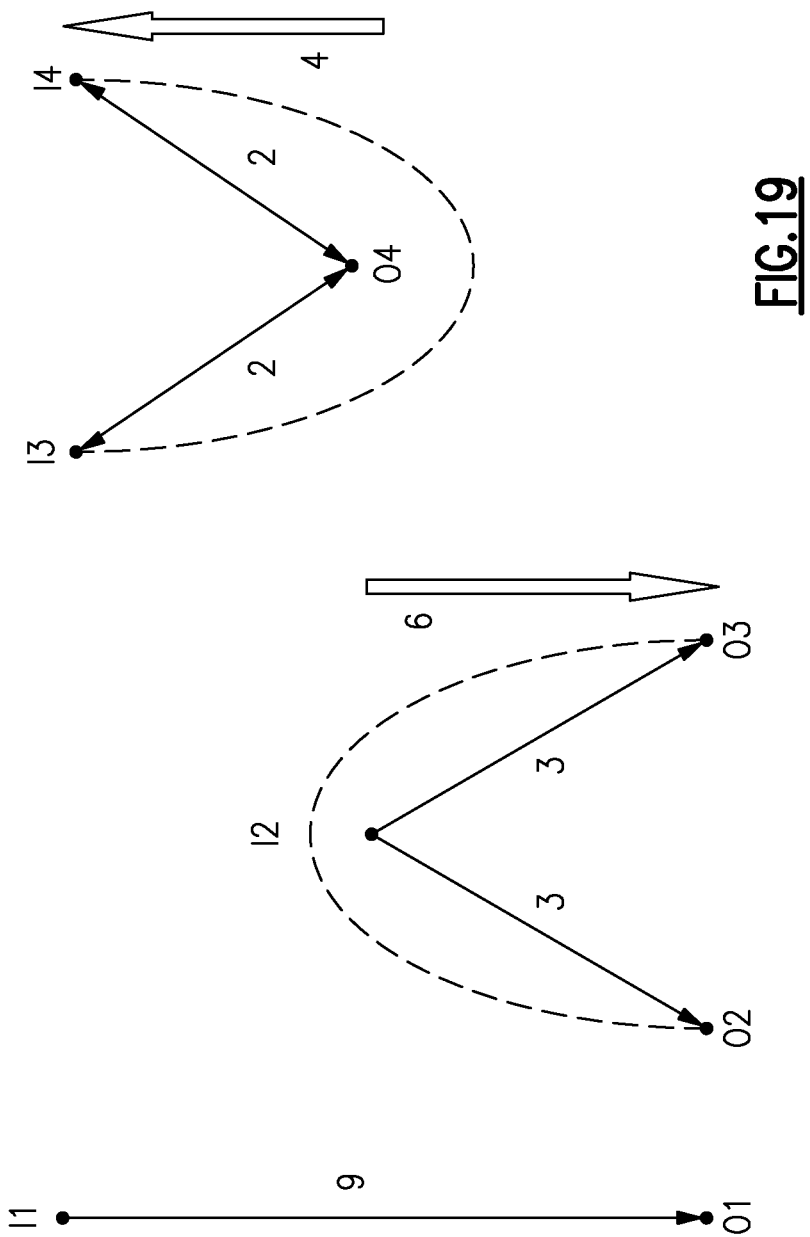
FIG. 19 is a block diagram illustrating the calculation of port positions in accordance with the invention.

FIG. 19 illustrates the port allocation performed in steps 1240 and 1250 of FIG. 12. The positions of an input port and an output port, which are connected to each other, are chosen such that a minimum height is achieved for the outline of the macro. For the example shown in FIG. 19, input port I1 and output port O1 are allocated such that a logic depth of 9 fits between these ports, I2, O2 and O3 are located such that a logic depth of 6 fits between ports I2 and O2 and I2 and O3. Similarly, input ports I3 and I4 and output port O4 are located such that a logic depth of 4 fits between ports O4 and I3 and O4 and I4, and therefore an aggregated logic depth of 6+4=10 is achieved, which means that the logic between I1 and O1 with logic depth 9 fits in the combined height. The connection between I1 and O1 has a distance weight of 9, between I2 and O2 it has a distance weight of 3, between I2 and O3 it has a distance weight of 3, between I3 and O4 it has a distance weight of 2, and between I4 and O4 it has a distance weight of 2. The port allocation method described above ensures that a minimum distance is achieved relatively between the input port I1, I2, I3, I4 and relatively between the output ports O1, O2, O3, O4. Therefore, the input ports and the output ports are pulled together.

Figure 20:
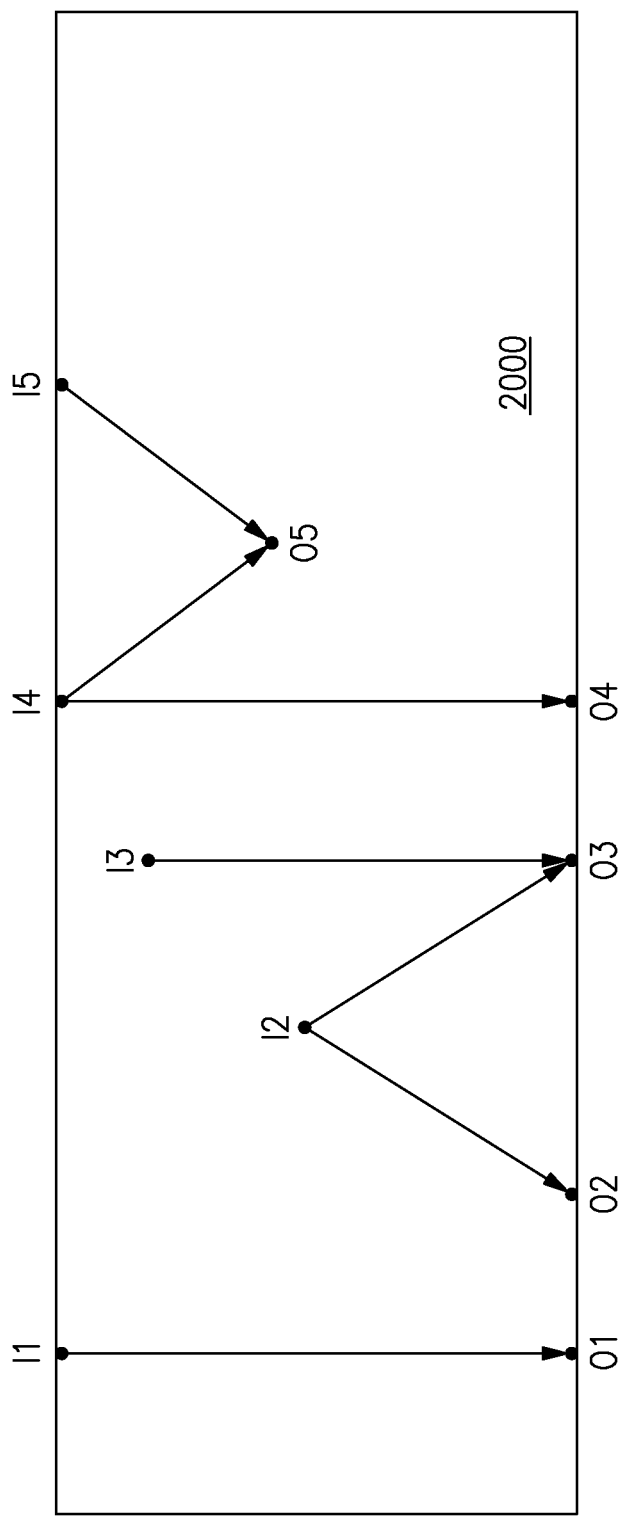
FIG. 20 is a block diagram illustrating port allocation for a macro in accordance with the invention.
Figure 21:
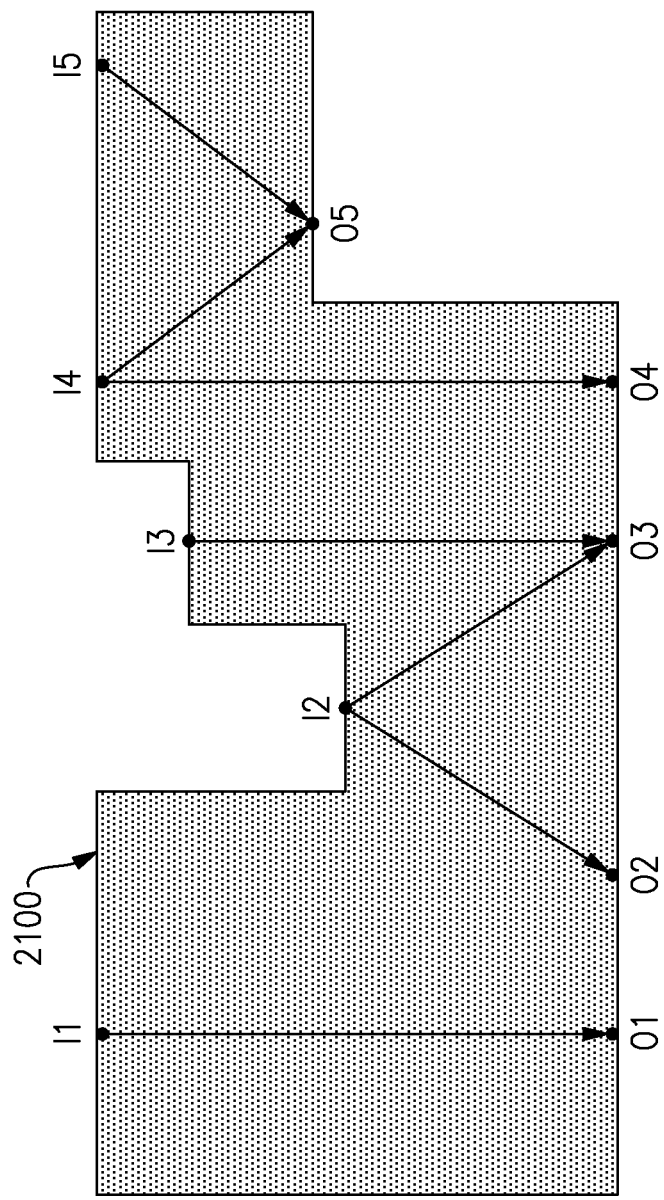
FIG. 21 is a block diagram illustrating the outline for the macro of FIG. 20 in accordance with the invention.

FIG. 20 illustrates a macro 2000 with input ports I1, I2, I3, I4, I5 and output ports O1, O2, O3, O4 after the port allocation. Input port I1 is connected with output port O1, I2 with O2 and O3, I3 with O3, I4 with O4 and O5, and I5 with O5. Ports I2, I3 and O5 are located within the outline of the macro 2000. Therefore, the unused areas can be cutoff based on the cones of influence. This results in the fractured outline shown in FIG. 21. There a macro 2100 is shown, which results from the modifications of the outline from macro 2000 in FIG. 20.

As shown in FIG. 13, for each of the (sub-)rectangles in the list 1320 it will be determined in step 1330 if its height is fixed. If the height is not fixed, it will be calculated in step 1340. For this calculation, the area utilization and port bounds on the IC or chip will be taken into consideration. Then in step 1350 it will be determined, if the width of the rectangle is fixed. If the width is not fixed, it will be calculated in step 1360. Then in step 1370 it will be checked if all (sub-)rectangles from the list 1320 were processed already. If not, then the next rectangle will be taken from the list 1320 and processed in step 1330. Otherwise the partitioning method is finished and the processing continues with step 1270 (likewise dimension) as shown in FIG. 12.

Figure 11:
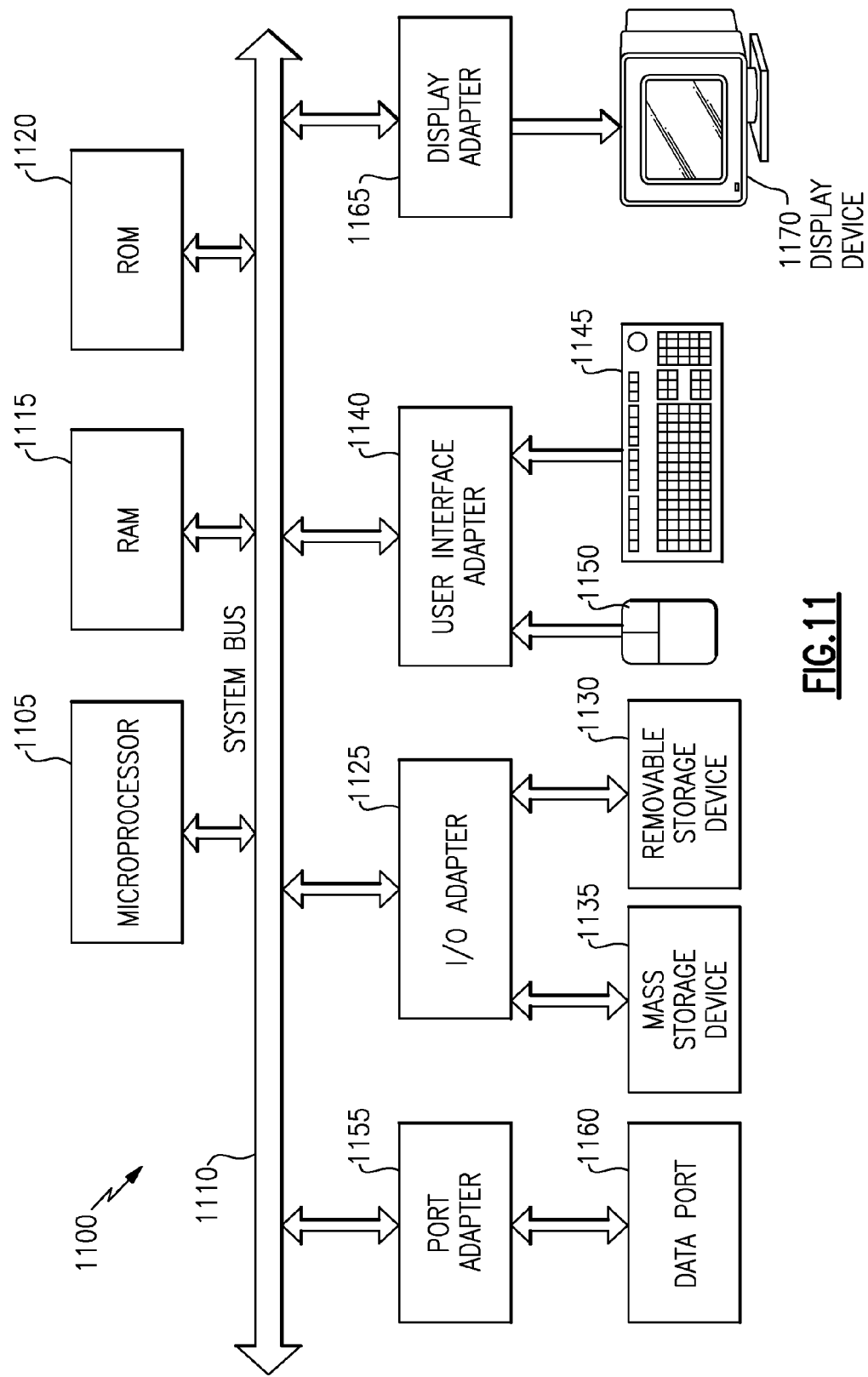
FIG. 11 is a schematic block diagram of a general-purpose computer suitable for practicing embodiments of the present invention.

Generally, the method embodiments disclosed herein may be practiced with a general-purpose computer and the method embodiments may be coded as a set of instructions on removable or hard media for use by the general-purpose computer. FIG. 11 is a schematic block diagram of a general-purpose computer suitable for practicing embodiments of the present invention. In FIG. 11, computer system 1100 has at least one microprocessor or central processing unit (CPU) 1105. CPU 1105 is interconnected via a system bus 1110 to a random access memory (RAM) 1115, a read-only memory (ROM) 1120, an input/output (I/O) adapter 1125 for connecting a removable data and/or program storage device 1130 and a mass data and/or program storage device 1135, a user interface adapter 1140 for connecting a keyboard 1145 and a mouse 1150, a port adapter 1155 for connecting a data port 1160 and a display adapter 1165 for connecting a display device 1170.

ROM 1120 contains the basic operating system for computer system 1100. The operating system may alternatively reside in RAM 1115 or elsewhere as is known in the art. Examples of removable data and/or program storage device 1130 include magnetic media such as floppy drives and tape drives and optical media such as CD ROM drives. Examples of mass data and/or program storage device 1135 include hard disk drives and non-volatile memory such as flash memory. In addition to keyboard 1145 and mouse 1150, other user input devices such as trackballs, writing tablets, pressure pads, microphones, light pens and position-sensing screen displays may be connected to user interface 1140. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 1130, fed through data port 1160 or typed in using keyboard 1145.

In view of the above, the present method embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits. A technical effect of the executable instructions is to implement the embodiments of the method described above and illustrated in FIGS. 12 and 13.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A computer implemented method for placement of random logic macros of an electronic circuit design, wherein said macros comprise any one of a fixed outline shape or a modifiable outline shape, the method comprising:
    modifying, by a computer, an outline of a modifiable outline shape macro based on criteria consisting of any one of a macro port weight value, a macro port ordering; a macro rapport constraint or a macro logic depth, the modifiable outline shape macro having ports defined at outermost edges of the modifiable outline shape macro;
    placing the modified modifiable outline shape macro at a location on an integrated circuit;
    binning, based on cones of influence of input ports to output ports, logic of the modifiable outline shape macro into two or more rectangles, each rectangle comprising circuits having logic depth less than a logic depth assigned to the rectangle; and
    arranging the two or more rectangles to form the modified outline shale macro.

2. The method of claim 1, wherein a modifiable outline shape macro has any one of a rectangular shape or a polygonal shape.

3. The method according to claim 2, further comprising:
    selecting and categorizing a macro from a netlist as the modifiable outline shape macro; and
    partitioning the selected modifiable outline shape macro.

4. The method of claim 3, further comprising:
    allocating the ports of the modifiable outline shape macro.

5. The method of according to claim 4, further comprising:
    comparing the dimensions of the modifiable outline shape macro with another macro having a fixed outline shape in vicinity of the modifiable outline shape macro; and
    placing the ports of the modifiable outline shape macro such that a rapport is formed with the another macro.

6. The method according claim 5, further comprising logically partitioning the modifiable outline shape macro into a plurality of rectangular macros, each rectangular macro having allocated ports of the modifiable outline shape macro.

7. A computer program product for placement of random logic macros of an electronic circuit design, wherein said macros comprise any one of a fixed outline shape or a modifiable outline shape, the computer program product comprising:
    a non-transitory computer readable storage medium storing instructions for performing a method comprising:
    modifying, by a computer, an outline of a modifiable outline shape macro based on criteria consisting of any one of a macro port weight value, a macro port ordering; a macro rapport constraint or a macro logic depth, the modifiable outline shape macro having ports defined at outermost edges of the modifiable outline shape macro;
    placing the modified modifiable outline shape macro at a location on an integrated circuit;
    binning, based on cones of influence of input ports to output ports, logic of the modifiable outline shape macro into two or more rectangles, each rectangle comprising circuits having logic depth less than a logic depth assigned to the rectangle; and
    arranging the two or more rectangles to form the modified outline shape macro.

8. The computer program product of claim 7, wherein a modifiable outline shape macro has any one of a rectangular shape or a polygonal shape.

9. The computer program product according to claim 8, further comprising:
    selecting and categorizing a macro from a netlist as the modifiable outline shape macro; and
    partitioning the selected modifiable outline shape macro.

10. The computer program product of claim 9, further comprising:
    allocating the ports of the modifiable outline shape macro.

11. The computer program product of according to claim 10, further comprising:
    comparing the dimensions of the modifiable outline shape macro with another macro having a fixed outline shape in vicinity of the modifiable outline shape macro; and
    placing the ports of the modifiable outline shape macro such that a rapport is formed with the another macro.

12. The computer program product according claim 11 further comprising logically partitioning the modifiable outline shape macro into a plurality of rectangular macros, each rectangular macro having allocated ports of the modifiable outline shape macro.

13. A system for placement of random logic macros of an electronic circuit design, wherein said macros comprise any one of a fixed outline shape or a modifiable outline shape, the system comprising:
    a memory; and
    a processor communicatively connected to said memory, the system configured to perform a method comprising:
    modifying, by the processor, an outline of a modifiable outline shape macro based on criteria consisting of any one of a macro port weight value, a macro port ordering; a macro rapport constraint or a macro logic depth, the modifiable outline shape macro having ports defined at outermost edges of the modifiable outline shape macro; and
    placing the modified modifiable outline shape macro at a location on an integrated circuit;
    binning, based on cones of influence of input ports to output ports, logic of the modifiable outline shape macro into two or more rectangles, each rectangle comprising circuits having logic depth less than a logic depth assigned to the rectangle; and
    arranging the two or more rectangles to form the modified outline shape macro.

14. The system of claim 13, wherein a modifiable outline shape macro has any one of a rectangular shape or a polygonal shape.

15. The system according to claim 14, further comprising:
selecting and categorizing a macro from a netlist as the modifiable outline shape macro; and
partitioning the selected modifiable outline shape macro.

16. The system of claim 15, further comprising:
allocating the ports of the modifiable outline shape macro.

17. The system of according to claim 16, further comprising:
comparing the dimensions of the modifiable outline shape macro with another macro having a fixed outline shape in vicinity of the modifiable outline shape macro; and
placing the ports of the modifiable outline shape macro such that a rapport is formed with the another macro.

18. The system according claim 17, further comprising logically partitioning the modifiable outline shape macro into a plurality of rectangular macros, each rectangular macro having allocated ports of the modifiable outline shape macro.

* * * * *